United States Patent
Srivastava et al.

(10) Patent No.: US 11,508,821 B2
(45) Date of Patent: Nov. 22, 2022

(54) GALLIUM NITRIDE DEVICE FOR HIGH FREQUENCY AND HIGH POWER APPLICATIONS

(71) Applicant: Analog Devices, Inc., Norwood, MA (US)

(72) Inventors: Puneet Srivastava, Wilmington, MA (US); James G. Fiorenza, Carlisle, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/975,917

(22) Filed: May 10, 2018

(65) Prior Publication Data

US 2018/0331186 A1    Nov. 15, 2018

Related U.S. Application Data

(60) Provisional application No. 62/505,586, filed on May 12, 2017.

(51) Int. Cl.
*H01L 29/40* (2006.01)
*H01L 29/205* (2006.01)
(Continued)

(52) U.S. Cl.
CPC ........ *H01L 29/404* (2013.01); *H01L 21/0254* (2013.01); *H01L 29/205* (2013.01);
(Continued)

(58) Field of Classification Search
CPC . H01L 21/746; H01L 21/7813; H01L 29/402; H01L 29/404; H01L 29/405; H01L 29/407; H01L 29/66462; H01L 29/7786
See application file for complete search history.

(56) References Cited

U.S. PATENT DOCUMENTS

| 6,265,289 B1 | 7/2001 | Zheleva et al. |
| 6,617,060 B2 | 9/2003 | Weeks, Jr. et al. |

(Continued)

FOREIGN PATENT DOCUMENTS

| CN | 101312207 A | 11/2008 |
| CN | 102412265 A | 4/2012 |

(Continued)

OTHER PUBLICATIONS

"Taiwanese Application Serial No. 107116285, Office Action dated Feb. 14, 2019", w/ English Translation, 8 pgs.

(Continued)

*Primary Examiner* — Peter M Albrecht

(74) *Attorney, Agent, or Firm* — Schwegman Lundberg & Woessner, P.A.

(57) ABSTRACT

A semiconductor device includes a layer of a first semiconducting material, where the first semiconducting material is epitaxially grown to have a crystal structure of a first substrate. The semiconductor device further includes a layer of a second semiconducting material disposed adjacent to the layer of the first semiconducting material to form a heterojunction with the layer of the first semiconducting material. The semiconductor device further includes a first component that is electrically coupled to the heterojunction, and a second substrate that is bonded to the layer of the first semiconducting material.

10 Claims, 5 Drawing Sheets

(51) Int. Cl.
*H01L 29/66* (2006.01)
*H01L 21/02* (2006.01)
*H01L 29/778* (2006.01)
*H01L 29/20* (2006.01)

(52) U.S. Cl.
CPC ...... *H01L 29/407* (2013.01); *H01L 29/66462* (2013.01); *H01L 29/778* (2013.01); *H01L 29/7786* (2013.01); *H01L 29/2003* (2013.01)

(56) References Cited

U.S. PATENT DOCUMENTS

| | | | |
|---|---|---|---|
| 7,550,783 B2 | 6/2009 | Wu et al. | |
| 8,283,699 B2 | 10/2012 | Wu | |
| 8,441,030 B2 | 5/2013 | Beach | |
| 8,823,012 B2 | 9/2014 | Lidow et al. | |
| 8,853,749 B2 | 10/2014 | Lidow et al. | |
| 9,112,009 B2 | 8/2015 | Charles et al. | |
| 9,666,677 B1* | 5/2017 | Raring | H01L 27/0605 |
| 11,355,598 B2 | 6/2022 | Srivastava et al. | |
| 2006/0071250 A1* | 4/2006 | Bude | H01L 29/812 |
| | | | 257/289 |
| 2009/0146224 A1 | 6/2009 | Heying et al. | |
| 2009/0148985 A1 | 6/2009 | Heying et al. | |
| 2010/0065923 A1 | 3/2010 | Charles et al. | |
| 2013/0153967 A1* | 6/2013 | Curatola | H01L 29/407 |
| | | | 257/194 |
| 2013/0234146 A1 | 9/2013 | Prechtl | |
| 2013/0256685 A1 | 10/2013 | Ohki | |
| 2013/0320400 A1 | 12/2013 | Hurkx et al. | |
| 2015/0155358 A1 | 6/2015 | Briere | |
| 2015/0311330 A1* | 10/2015 | Li | H01L 29/404 |
| | | | 257/76 |
| 2015/0318388 A1 | 11/2015 | Schubert et al. | |
| 2016/0064538 A1 | 3/2016 | Nakayama et al. | |
| 2016/0071967 A1 | 3/2016 | Prechtl et al. | |
| 2016/0141405 A1* | 5/2016 | Werner | H01L 29/7786 |
| | | | 257/76 |
| 2016/0254363 A1 | 9/2016 | Suh et al. | |
| 2016/0380090 A1* | 12/2016 | Roberts | H01L 22/32 |
| | | | 257/76 |
| 2017/0294528 A1* | 10/2017 | Ren | H01L 29/4175 |
| 2018/0175186 A1 | 6/2018 | Chen et al. | |
| 2020/0013862 A1 | 1/2020 | Srivastava et al. | |
| 2020/0219871 A1 | 7/2020 | Moens et al. | |

FOREIGN PATENT DOCUMENTS

| | | | |
|---|---|---|---|
| CN | 103165445 A | | 6/2013 |
| CN | 103715257 A | | 4/2014 |
| CN | 103730360 A | | 4/2014 |
| CN | 104201283 A | | 12/2014 |
| CN | 104241351 A | | 12/2014 |
| CN | 104599957 A | * | 5/2015 |
| CN | 106298904 A | | 1/2017 |
| CN | 112368843 A | | 2/2021 |
| EP | 1884999 A1 | | 2/2008 |
| EP | 1659622 B1 | | 10/2016 |
| JP | 2011238701 | | 11/2011 |
| JP | 2011238701 A | * | 11/2011 |
| TW | 200830550 | | 7/2008 |
| TW | I397998 | | 6/2013 |
| TW | 201340325 A | | 10/2013 |
| TW | I449173 | | 8/2014 |
| TW | I509795 | | 11/2015 |
| WO | WO-2020010253 A1 | | 1/2020 |

OTHER PUBLICATIONS

U.S. Appl. No. 15/975,917, Srivastava, Puneet, et al.
"International Application Serial No. PCT/US2019/040598, International Search Report dated Oct. 10, 2019", 4 pgs.
"International Application Serial No. PCT/US2019/040598, Written Opinion dated Oct. 10, 2019", 4 pqs.
"Taiwanese Application Serial No. 108123749, Office Action dated Sep. 22, 2020", w/o English Translation, 5 pgs.
"German Application Serial No. 102018111332.3, Office Action dated Oct. 27, 2020", w/o English Translation, 9 pgs.
"U.S. Appl. No. 16/502,285, Response filed Mar. 8, 2021 to Restriction Requirement dated Jan. 6, 2021", 10 pgs.
"U.S. Appl. No. 16/502,285, Restriction Requirement dated Jan. 6, 2021", 7 pgs.
"Chinese Application Serial No. 201810456541.3, Office Action dated Dec. 1, 2020", w/o English Translation, 13 pgs.
"Chinese Application Serial No. 201810456541.3, Response filed Apr. 16, 2021 to Office Action dated Dec. 1, 2020", w/ English claims, 16 pgs.
"German Application Serial No. 102018111332.3, Response filed Feb. 25, 2021 to Office Action dated Oct. 27, 2020", w/ English claims, 18 pgs.
"International Application Serial No. PCT/US2019/040598, International Preliminary Report on Patentability dated Jan. 21, 2021", 6 pgs.
"Taiwanese Application Serial No. 108123749, Response filed Nov. 30, 2020 to Office Action dated Sep. 22, 2020", w/ English claims, 40 pgs.
"U.S. Appl. No. 16/502,285, Response filed Oct. 11, 2021 to Non Final Office Action dated Jun. 9, 2021", 13 pgs.
"Chinese Application Serial No. 201810456541.3, Office Action dated Jun. 24, 2021", w/ English Translation, 30 pgs.
"U.S. Appl. No. 16/502,285, Non Final Office Action dated Jun. 9, 2021", 11 pgs.
"Chinese Application Serial No. 201980045444.8, Voluntary Amendment filed Jun. 9, 2021", w/ English Claims, 18 pgs.
"Chinese Application Serial No. 201810456541.3, Response filed Aug. 25, 2021 to Office Action dated Jun. 24, 2021", w/ English Claims, 15 pgs.
"U.S. Appl. No. 16/502,285, Corrected Notice of Allowability dated May 6, 2022", 2 pgs.
"Chinese Application Serial No. 201810456541.3, Notice of Reexamination dated Jun. 1, 2022", W/O English Translation, 2 pgs.
"Chinese Application Serial No. 201810456541.3, Response filed Mar. 25, 2022 to Decision of Rejection dated Mar. 3, 2022", w/ English Claims, 16 pgs.
"Chinese Application Serial No. 201810456541.3, Response filed Jun. 14, 2022 to Notice of Reexamination dated Jun. 1, 2022", w/ English Claims, 12 pgs.
"U.S. Appl. No. 16/502,285, Corrected Notice of Allowability dated Mar. 25, 2022", 2 pgs.
"U.S. Appl. No. 16/502,285, Notice of Allowance dated Dec. 15, 2021", 11 pgs.
"Chinese Application Serial No. 201810456541.3, Decision of Rejection dated Mar. 3, 2022", w/o English translation, 8 pgs.
"European Application Serial No. 19831547.5, Partial Supplementary European Search Report dated Mar. 10, 2022", 12 pgs.
"European Application Serial No. 19831547.5, Extended European Search Report dated Jun. 30, 2022", 14 pgs.
"Chinese Application Serial No. 201810456541.3, Office Action dated Jul. 27, 2022", w/o English translation, 6 pgs.
"Chinese Application Serial No. 201810456541.3, Response filed Aug. 16, 2022 to Office Action dated Jul. 27, 2022", w/ English Claims, 18 pgs.
"Chinese Application Serial No. 201810456541.3, Response to Examiner Telephone Interview filed Sep. 9, 2022", w/ English Claims, 13 pgs.

\* cited by examiner

GALLIUM NITRIDE DEVICE FOR HIGH FREQUENCY AND HIGH POWER APPLICATIONS

CLAIM OF PRIORITY

This patent application claims the benefit of priority of U.S. Provisional Patent Application Ser. No. 62/505,586, titled "GaN Device for High Frequency and High Power Applications," filed on May 12, 2017, which is hereby incorporated by reference herein in its entirety.

FIELD OF THE DISCLOSURE

This document pertains generally, but not by way of limitation, to semiconductor devices, and more particularly, to techniques for constructing gallium nitride devices with backside field plates and techniques for transferring layers of a semiconductor device from an epitaxial substrate to a thermally conductive substrate such as to permit the epitaxial substrate to be reused.

BACKGROUND

Design of integrated circuits in gallium nitride (GaN) fabrication technology is being increasingly adopted in the semiconductor manufacturing industry due to its advantages over silicon (Si) fabrication technology. These advantages can include high bandwidth and high temperature operation, as well as increased device breakdown voltages. These advantages are derived, at least in part, from the higher bandgap voltage of GaN as compared to Si (e.g., GaN has a bandgap voltage of 3.49 eV, while Si has bandgap voltage of 1.1 eV). The advantages of GaN circuits over Si circuits can also be attributed to the higher critical breakdown field of GaN as compared to Si (e.g., GaN has a critical breakdown field of 3 MV/cm, while Si has a critical breakdown field of 0.3 MV/cm). In addition to the previously mentioned advantages, the epitaxial fabrication of GaN circuits on a high resistivity silicon substrate has made GaN fabrication technology affordable and applicable for a wide range of applications. However, the thermal conductivity of the underlying silicon substrate limits dissipation of the thermal energy produced by these circuits in high frequency and high power applications.

Figure 1:
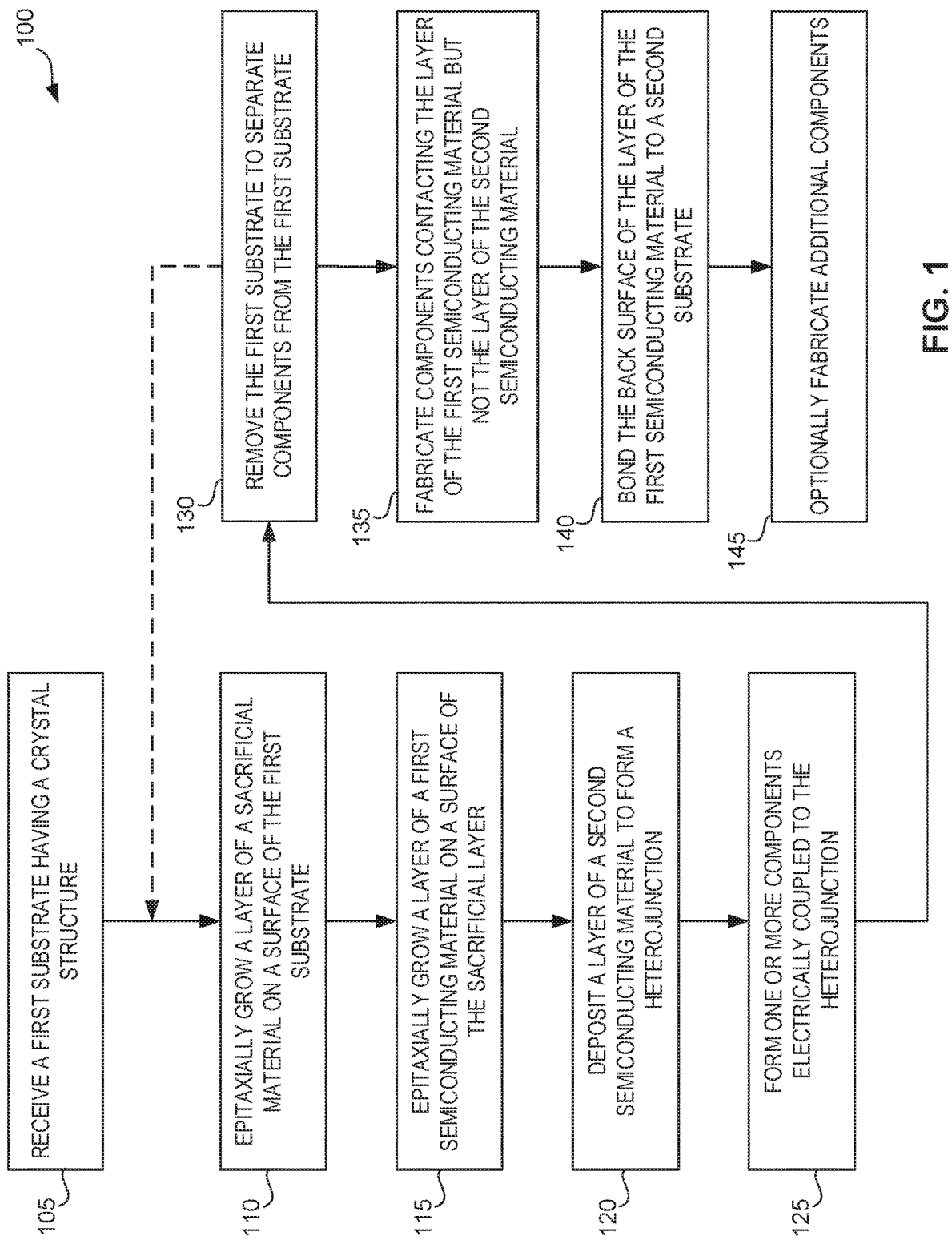
FIG. 1 illustrates a flowchart of a technique, such as a method, used to fabricate an electronic device, according to various embodiments.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure describes, among other things, a gallium nitride device (e.g., high electron mobility transistor) such as having a backside field plate formed using a back side processing technique after removing layers of the GaN device from a substrate. The backside field plate can help deplete channel electrons and can help distribute an electric field in the GaN device, such as to enable operation of the device at higher voltages, such as to enable the construction of high power electronic circuits. The present disclosure additionally includes a process for removing one or more epitaxial layers of a GaN device from an attached substrate, such as to enable the substrate to be reused to grow one or more additional epitaxial layers of other GaN devices. Such substrate reuse can help significantly reduce the cost of GaN device fabrication.

Illustrative embodiments include a semiconductor device that may be used at high power densities and high frequencies, and methods for making such a device. In this context a high power density may be a power density greater than 5 watts per millimeter (W/mm) and a high frequency may be a frequency greater than 5 gigahertz (GHz). Semiconducting material may be grown on a substrate epitaxially, so the material takes on the crystal structure of the substrate. In accordance with various embodiments disclosed herein, the substrate may be used for its crystal structure during a fabrication process, such as to determine the crystal structure of the semiconducting material of the semiconductor device, but is not used as part of the semiconductor device.

In accordance with various embodiments, a sacrificial layer may be epitaxially grown on an initial substrate, and semiconducting material of a semiconductor device may then be epitaxially grown on the sacrificial layer, such as to cause both layers to obtain a crystal structure formed and based upon the crystal structure of the substrate. Further layers may then be formed during the fabrication process. After the formation of one or more layers of the semiconductor device, the sacrificial layer may be removed, and the initial substrate may be separated from the layers of the semiconductor device. In some examples, the device may be partially formed when the initial substrate is separated. A temporary carrier may be used to facilitate handling of the separated layers. The first formed layer may be exposed after separation of the initial substrate. Such exposure may enable additional device processing such as through the first formed layer (e.g., from the backside of the device). Moreover, the exposed first formed layer may be bonded to a different substrate, such as substrate having a high thermal conductivity that may act as a heat sink during high power operation of the semiconductor device. The temporary carrier may then be removed from the semiconductor device. Details of illustrative embodiments are discussed below.

For concreteness, the semiconductor device described herein may include a high electron-mobility transistor ("HEMT"). Such an HEMT may include field-effect transistor ("FET") including at least two semiconducting materials having different band gaps (a "hetero-structure"). The charge carrying channel of the HEMT may be located at the interface between the two semiconducting materials (a "heterojunction"). It should be appreciated that other semiconductor devices may be fabricated using the techniques described herein.

The semiconducting materials in an HEMT may be a chemical compound of elements from different groups in the periodic table. Such compounds may include a pairing of elements from group 13 the group comprising boron (B), aluminum (Al), gallium (Ga), indium (In), and thallium (Tl)) with elements from group 15 (i.e., the group comprising nitrogen (N), phosphorus (P), arsenic (As), antimony (Sb), and bismuth (Bi)). It should be appreciated that some literature refers to group 13 of the periodic table as Group III and group 15 as Group V. Without limitation, an HEMT may be fabricated from gallium nitride (GaN) and aluminum indium gallium nitride (AlInGaN). Additionally, HEMTs may be fabricated using AlN/GaN/AlN hetero-structures, InAlN/GaN, or other combinations of group 13 and group 15 elements.

As used herein, the term epitaxy refers to the formation (e.g., deposition or growth) of a crystalline layer or film on the surface of crystalline substrate, whereby the formed layer takes on the crystal structure and lattice properties of the substrate. Epitaxy may be used in semiconductor device fabrication to form thin-films of single crystals. Epitaxy may be performed in the vapor phase, liquid phase, or solid phase. In some embodiments, molecular beam epitaxy ("MBE") may be used for growing semiconductor crystals from elements in groups 13 and 15, although it should be appreciated that other forms of epitaxy may be used with the techniques described herein.

FIG. 1 is a flowchart of a technique 100, such as a method, used in fabricating an electronic device, according to various embodiments. The technique 100 can begin at process 105 by receiving a first substrate having a crystal structure. The first substrate may be a wafer, such as a wafer of sapphire ($\alpha$-$Al_2O_3$), gallium nitride (GaN), gallium arsenide (GaAs), silicon (Si), silicon carbide (SiC) in any of its polymorphs (including wurtzite), aluminum nitride (AlN), indium phosphide (InP), or similar substrate material used in the manufacture of semiconductor devices. Note, however, that the ultimate semiconductor device may not use the electrical properties of the first substrate, so other substrates having unusual or different crystal structures may be received in process 105.

In process 110, a layer of sacrificial material may be epitaxially grown on the surface of the first substrate. The sacrificial material may be used to separate formed (e.g., partially formed or fabricated) device components from the first substrate. Accordingly, the sacrificial material may be selected to permit easy removal of the device components, such as by a chemical etch or one or more mechanical or chemical processes to remove the sacrificial material when desired. Such sacrificial material may also include an etch stop layer to permit removal of the substrate without damaging the epitaxial layers on top of the substrate or a nucleation layer. Such sacrificial material may include layers of graphene, which may be removed by coating the surface of the layers of graphene with thick bonding polymers and then applying metal to peel the layers of graphene off the substrate and the first semiconductor layer. The sacrificial layer may be Aluminum Nitride. Other sacrificial materials may be selected, such as according to a function of cost-effectiveness or availability of materials or fabrication techniques.

In process 115, a layer of a first semiconducting material (a first layer), such as a GaN, may be epitaxially grown on the surface of the sacrificial layer, such as to form a heteroepitaxial thin-film. The quality of a GaN heteroepitaxial thin-film may depend on one or more of the properties of the substrate received in process 105. Such properties may include a lattice constant, a thermal expansion coefficient, and process-induced properties such as surface roughness, step height, and terrace width; see, e.g., L. Liu et al., "Substrates for gallium nitride epitaxy", Materials Science and Engineering: R: Reports, vol. 37, issue 3, 30 Apr. 2002, pp. 61-127. Thus, these properties should be carefully controlled. Adequate control of these properties may enable the formation of a layer of GaN having extremely high purity or consistency.

In process 120, a layer of a second semiconductor material (a second layer), such as AlInGaN, may be epitaxially grown on the surface of the first layer, thereby forming a heterojunction. The layer of second semiconductor material may be formed in the same manner as the first layer, such by epitaxial growth, or using another thin-film formation technique, such as chemical vapor deposition (CVD). The first and second semiconductor materials may be selected to have different bandgaps, such as to form a heterojunction at the interface between the surface of the first semiconductor material and the surface of the second semiconductor material. Such a selection may enable a two-dimensional electron gas (2DEG) to form at the heterojunction. The charge carriers (electrons) in the 2DEG may have a high mobility, and a proportionally high drift velocity, due to reduced scattering provided by the heterojunction structure, e.g., relative to a bulk semiconductor substrate.

In process 125, one or more device components may be formed and electrically coupled to the heterojunction (e.g., a source electrode, a gate electrode, and drain electrode). Forming these device components may include forming a layer of passivating material over the layer of the second semiconducting material such as to help inhibit or prevent corrosion, such as shown at 205 in the cross section of the structure in FIG. 2.

Figure 2:
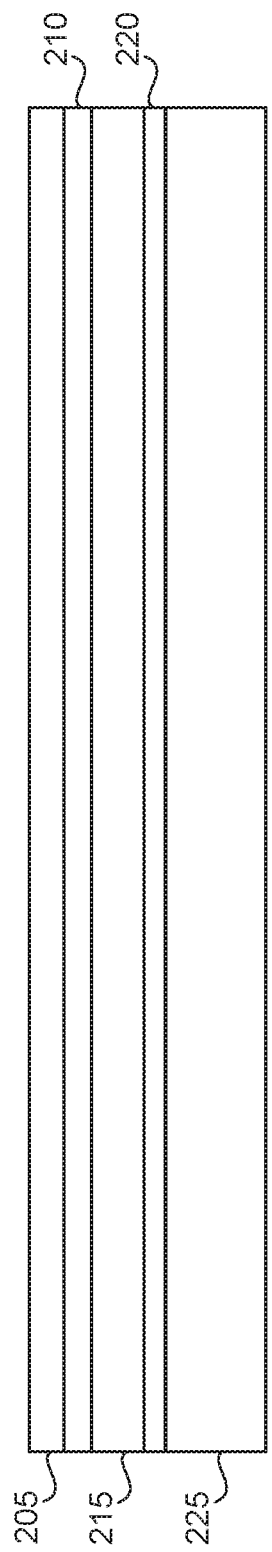
FIG. 2 illustrates a cross section of layers of materials provided after an initial phase of layer formation in fabricating a semiconductor device, according to various embodiments.

FIG. 2 illustrates a cross section of layers of materials provided after an initial phase of layer formation in fabricating a semiconductor device, according to various embodiments. FIG. 2 shows a passivation layer 205, a layer of a second semiconductor material (AlInGaN) 210, a layer of a first semiconductor material (GaN) 215, a sacrificial layer (graphene) 220, and a first substrate 225. A heterojunction is formed at the interface between the layer of the first semiconductor material 215 and the second layer 210.

Figure 3:
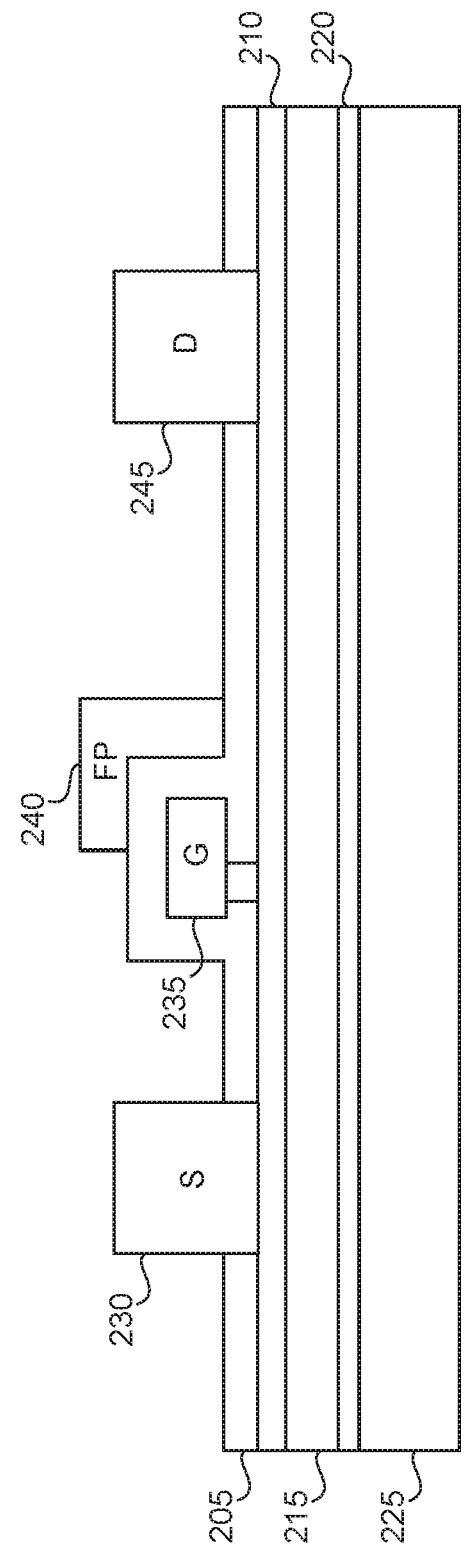
FIG. 3 illustrates a cross section of layers after fabricating components of a semiconductor device, according to various embodiments.

FIG. 3 illustrates a cross section of layers after fabricating components of a semiconductor device, according to various embodiments. More specifically, FIG. 3 shows one or more components of a semiconductor device, such as an HEMT, after the components have been fabricated. In addition to the components shown in FIG. 2, FIG. 3 depicts a source electrode 230, a gate electrode 235, a field plate 240, a drain electrode 245. In a transistor example of the semiconductor device, majority charge carriers, such as electrons in an n-doped system or "holes" in a p-doped system, may flow between the source electrode 230 and the drain electrode 245, such as to form an electrical current. The size of the electrical current may be regulated by an electric field produced at the gate electrode 235, such as by applying a difference in electrical potential, or a voltage, between the source electrode 230 and the gate electrode 235.

The field plate 240 (e.g., a frontside field plate) may be used to help inhibit or prevent electrical breakdown between the gate electrode 235 and the drain electrode 245. The material between the gate electrode 235 and the drain electrode 245 may have a breakdown voltage, at which the difference in electrical potential between the gate electrode and the drain electrode may cause the material to become electrically conductive. Above the breakdown voltage, this material may provide an alternate path for electrical current to flow in the semiconductor device. In some devices, electrical current flow in this alternative path may manifest as an "electric arc", and may cause damage to the semiconductor device. In other devices, electrical current flow in this alternative path may manifest as a soft current leakage from the gate electrode 235 to the layer of the second semiconducting material 210.

Voltage may be computed as the product of the size of an electric field between two points and the distance between the points. While, for given implementation of the semiconductor device, the distance between the gate electrode 235 and the drain electrode 245 may be fixed, the field plate 240 may spatially distribute the electric field generated between the two electrodes over a conductor having a large area, such as to reduce the flux of the electric field through any given point, such as to reduce the voltage between the gate electrode 235 and the drain electrode 245. Such distribution of the electric field may enable higher voltages to be used at the gate electrode 235 before breakdown, such as to help increase the power density of the semiconductor device.

Figure 4:
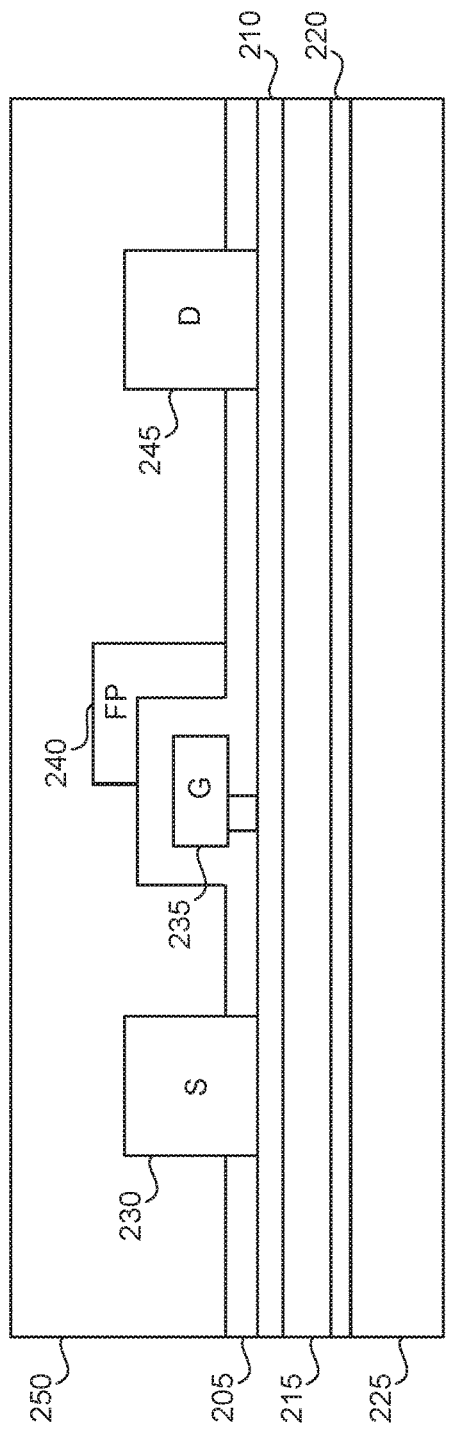
FIG. 4 illustrates a cross section of layers of a semiconductor device after a temporary carrier is attached, according to various embodiments.

FIG. 4 illustrates a cross section of layers of a semiconductor device after a temporary carrier 250 is attached, according to various embodiments. The temporary carrier 250 may be attached to the top component layers of the semiconductor device in preparation for separating the fabricated components of the semiconductor device from the first substrate 225. The temporary carrier 250 may be any carrier suitable for layer transfer, and in an example may be bonded to the top surface of the semiconductor device using a removable adhesive.

Figure 5:
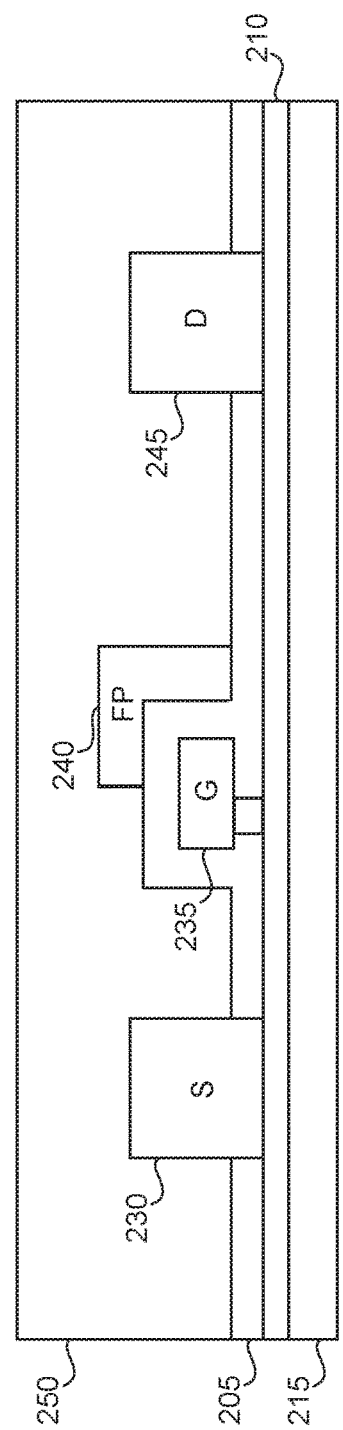
FIG. 5 illustrates a cross section of layers of a semiconductor device after a sacrificial layer has been removed to separate an initial substrate from the layers of the semiconductor device, according to various embodiments.

Returning to the technique 100, in process 130, the first substrate 225 may be removed from the fabricated components of the semiconductor device. In some example implementations of the technique 100, removing the first substrate 225 may include removing the sacrificial layer 220. In other example implementations of the technique 100, the sacrificial layer 220 may operate as an etch stop layer, such as to terminate an etching process used to remove the first substrate 225. Removal of the first substrate 225 is shown in FIG. 5 by the absence of the first substrate 225. In certain example implementations of the technique 100, removal of the first substrate 225 may expose a surface of the layer of first substrate 225, such as to permit recovering the first substrate 225 as it was initially provided in process 105. Accordingly, the first substrate 225 may be reused for further iterations of the technique 100, such as to fabricate additional semiconductor devices, such as shown by the arrow from process 130 to process 110. This differs from other techniques in which the first substrate 225 is used as a component of the fabricated semiconductor device, or where the first substrate 225 is otherwise not reusable for subsequent manufacturing. Reuse of the first substrate 225 may lead to significant cost savings. For example, a four-inch diameter GaN wafer may cost between $10,000 to $15,000, while a similar SiC wafer may cost between $15,000 and $20,000. In accordance with the reuse of the first substrate 225 just described, the cost of a new wafer may be saved for each wafer of components produced using the reused substrate 225.

Figure 6:
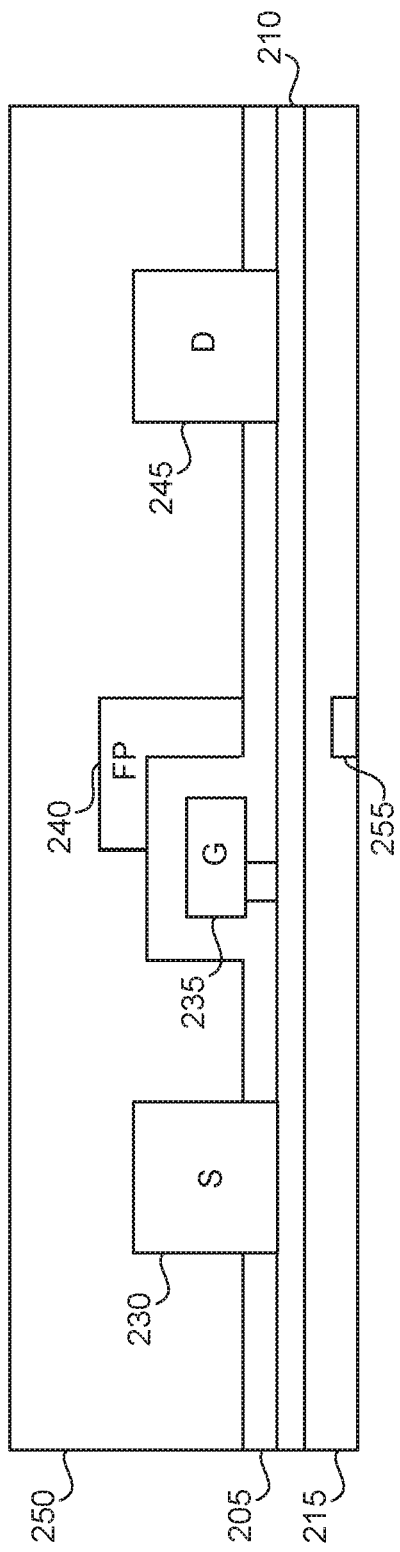
FIG. 6 illustrates a cross section of layers of a semiconductor device after back side processing has been performed, according to various embodiments.

Removal of the first substrate layer 225, and the layer of sacrificial material 220, may also expose a surface of the layer of the first semiconducting material (GaN) 215, such as to make its exposed surface available for further processing. Consequently, in process 135, the technique 100 may be executed to optionally fabricate one or more device components on the back surface of the exposed layer of the first semiconducting material 215. An example of such a device component is shown in FIG. 6 as a backside field plate 255. The backside field plate 255 may be used to help deplete the channel electrons and to help distribute an electric field in a semiconductor device manufactured according to the technique 100, as described herein, such as to help inhibit or avoid breakdown. This may enable a high voltage to be applied to the drain electrode or the gate electrode without damaging the semiconductor device.

The backside field plate 255 may have a density of minority charge carriers that is greater than that of the layer of the first semiconducting material 215. As used herein, minority charge carriers may include holes or positively charged ions. To provide path separation between the backside field plate 255 and the layer of the first semiconducting material 215, the backside field plate 255 shown in FIG. 6 can be formed such that it contacts the layer of the first semiconducting material 215 but does not contact the layer of the second semiconducting material (AlInGaN) 210. Consequently, the backside field plate 255 does not contact the 2DEG formed when the semiconductor device fabricated according to the technique 100 is in operation.

The backside field plate 255 may be formed according to one or more techniques in process 135. Such techniques may include forming the backside field plate 255 by thinning, such as by using chemical mechanical planarization (CMP) techniques, the layer of the first semiconducting material 215 to an appropriate thickness, such as a thickness determined by a desired geometry or thickness of the backside field plate. The backside field plate may then be formed by depositing a conductive element, such as a metal, over the masked layer of the first semiconducting material 215, followed by further processing, such as to remove the mask leaving the conductive backside field plate.

Some techniques may include forming the backside field plate 255 may include selectively etching a cavity in the layer of the first semiconducting material 215, followed by selectively depositing the metallic element including in the cavity. The cavity may be etched in the first semiconducting material 215 using a dry GaN etching technique such as using an inductively coupled plasma or a reactive ion etching process.

Other techniques may include forming the backside field plate 255 as a hetero-structure, having a high density of minority charge carriers, followed by ion implant in the region outside the backside field plate 255, such as to electrically isolate the field plate from other areas of the substrate. This may be followed by connecting the backside field plate 255 to the source electrode 230. Such a hetero-structure may be formed by forming, such as by ion implant, a p-type GaN field plate material adjacent to an unintentionally doped GaN layer, such as the layer of the first semiconducting material 215 containing impurities due to the GaN growth process. Such hetero-structures may enable the formation of backside field plates without substantially altering the topology of the exposed surface of the layer of the first semiconducting material 215, such as by not depositing or bonding additional material to the surface of the layer of the first semiconducting material 215.

Another technique may include forming the backside field plate 255 by low temperature molecular beam epitaxy (MBE) regrowth of a layer having a high electrical conductivity, such as silicon doped GaN, adjacent to the layer of the first semiconducting material 215. In some embodiments, MBE regrowth of source/drain ohmic contacts, such as in process 145, and manufacture of the backside field plate 255 may be combined in a single process. Other techniques may be used to form the backside field plate 255 in process 135.

The distance between the backside field plate 255 and the 2DEG formed may affect the performance of the backside field plate, such as by increasing or decreasing the amount of the electric field distributed by the backside field plate, such as to determine the voltage that may be applied to the gate electrode 235 or the drain electrode 245 without damaging the semiconductor device. Accordingly, techniques for forming backside field plate 255 that include etching or thinning the layer of the first semiconducting material 215 may further include embedding a layer of etch stop material within the layer of the first semiconducting material, such as to determine the depth to which the layer of the first semiconducting material may be thinned, or the depth to which the layer of the first semiconducting material may be thinned, such as to determine the distance between the backside field plate 255 and the 2DEG. Such etch stop material may include AlN, AlGaN, or InAlN. Embedding the etch stop layer may include partially growing the layer of the first semiconducting material to a desired height, depositing the etch stop material on the partially grown layer, followed by finishing the growth of the layer of the first semiconducting material.

In some embodiments, the backside field plate 255 may be formed in a process earlier in the technique 100 than at process 135, such as to enable process 135 to be used for other manufacturing processes that involve access to the back side of the layer of the first semiconducting material 215. For example, the backside field plate 255 may be formed by non-selective p-doped epitaxy during formation of the layer of the first semiconducting material 215, and process 135 may include ion implantation in the region outside the backside field plate 255, followed by connecting the backside field plate 255 to the source electrode 230. In an example, the backside field plate 255 may be formed by selective p-doped epitaxy such as during formation of the layer of the first semiconducting material 215, and process 135 may include connecting the field plate 255 to the source electrode 230.

FIG. 6 illustrates a cross section of layers a semiconductor device after backside processing has been performed, according to various embodiments. It may be appreciated from FIG. 6 that the backside field plate 255 may be formed such as to be aligned with a frontside field plate 240. Such alignment may include aligning an edge of the backside field plate closest to the drain electrode 245 with an edge of the frontside plate 240 closest to the drain electrode. This alignment may, in use, help further reduce the flux of the electric field distributed by the backside field plate 255, such as to enable the semiconductor device to be driven by higher voltages. Additionally, the backside field plate 255 may be aligned using a self-aligning process. Such a self-aligning process may include manufacturing a portion of the gate electrode 235 and frontside field plate 240, such as by executing the technique 100 through process 130. Such a self-aligning process may then include applying a photoresist to the backside of the layer of the first semiconducting material 215, and shining non-selective light from the frontside of the semiconductor device to expose the photoresist, such as to use the structure of the frontside field plate 240 itself as a mask. Such non-selective light may have a wavelength or photon energy selected according to the bandgap of the layer of the first semiconductor material 215 and the bandgap of the layer of second semiconducting material 210, such as to enable the light to pass through these layers without being absorbed. As an example, light having photon energy lower than the bandgap energy of GaN (e.g., 3.3 electron-volts) may not be absorbed by a GaN layer, such as to cause the GaN layer to appear transparent to this light. After exposure, the backside photoresist may be removed, allowing formation of the backside field plate 255 in precise registration with the front side field plate 240. Alternately, self-alignment may be achieved by shining light non-selectively from the back side of the semiconductor device, such as to cause the light to reflect only off the frontside field plate 240, thereby doubling its intensity at the desired location of the backside field plate 255.

Because the back side of the layer of the first semiconducting material 215 is exposed after executing process 130, any number of backside field plates 255 may be fabricated on the exposed layer of the first semiconducting material 215. In combination with the self-aligning processes just described, any number of front-and-back aligned field plate structures may be incorporated into the semiconductor device, such as for proportionally reducing the electric flux and increasing the operating voltage and power density of the device. Other processing may be performed in process 135, such as to optionally fabricate components contacting the layer of the first semiconducting material 215.

Figure 7:
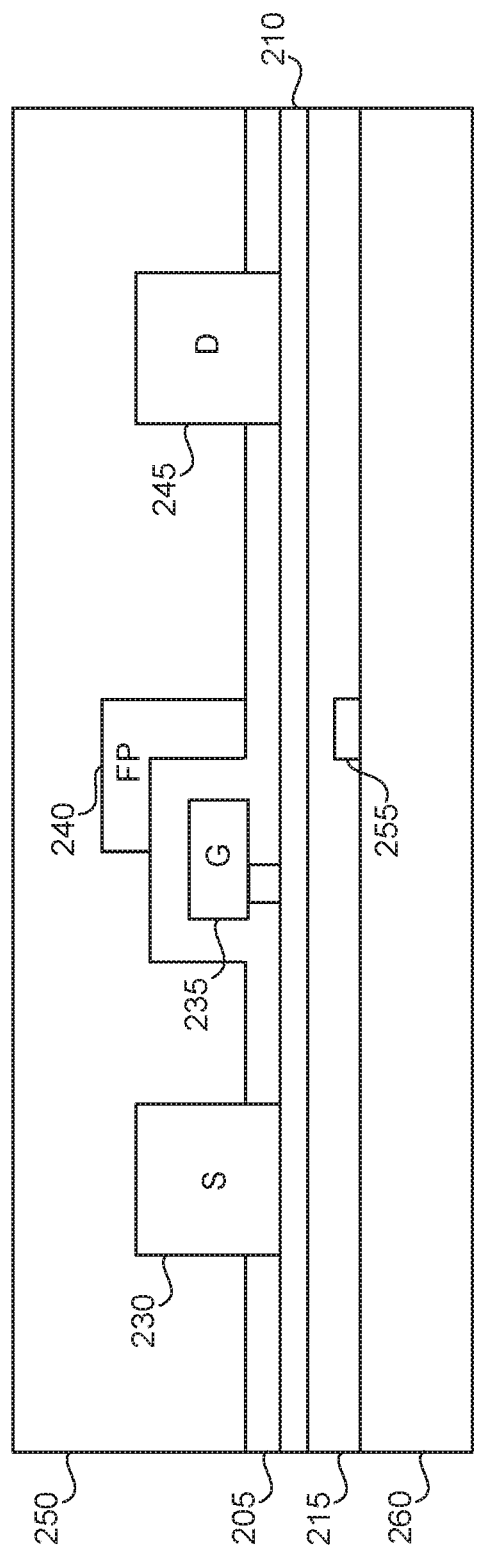
FIG. 7 illustrates a cross section of layers of a semiconductor device after bonding of the back side of the semiconductor device to a second substrate, according to various embodiments.

In process 140, the back surface of the layer of the first semiconducting material 215 may be bonded to a second substrate 260, such as to form the structure shown in FIG. 7. The second substrate 260 may be selected for properties other than or in addition to its crystal structure. For example, the second substrate 260 may be made of a "heat sink" material having a thermal conductivity that is higher than that of the first substrate 215, such as SiC, diamond, or AlN. Bonding a material having high thermal conductivity to the fabricated components of the semiconductor device may permit the semiconductor device to operate at temperatures that are higher than the temperatures at which the semiconductor device would be able to operate if the semiconductor device remained bonded to only the first substrate. Such bonding may also permit the semiconductor device to operate using higher currents than it otherwise could, regardless of the breakdown voltage.

In process 145, one or more components of the semiconductor device may be fabricated to complete the semiconductor device manufacturing process. For example, if the self-aligning processes previously described are used, the backside field plate 255 may be manufactured before manufacturing the source electrode 230 and drain electrode 245. To access the top surface of the passivating layer 205 to manufacture these additional components, the temporary carrier 250 may be removed, such as by thermal release or UV curing technique. The structure resulting from this removal (and subsequent fabrication of the source electrode 230 and drain electrode 245) is shown in FIG. 8.

Figure 8:
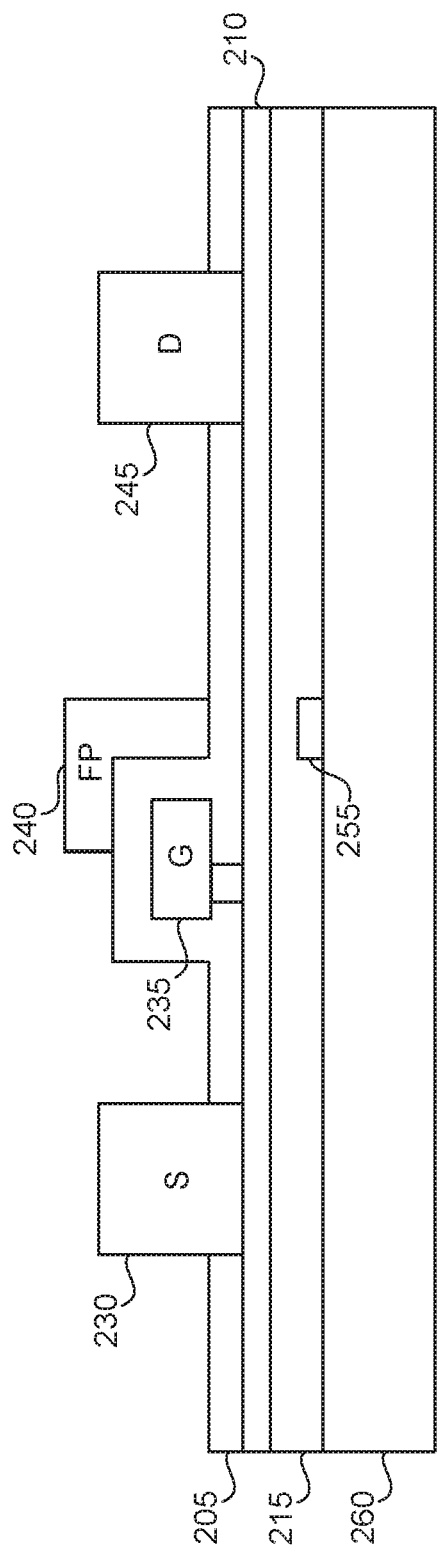
FIG. 8 illustrates a cross section of layers of a semiconductor device after removal of a temporary carrier, according to various embodiments.

FIG. 8 illustrates a cross section of layers of a semiconductor device after removal of a temporary carrier, according to various embodiments. The technique 100 can be executed to fabricate a semiconductor device that includes (1) a layer of a first semiconducting material 215 that was epitaxially grown to have a crystal structure of a first substrate, (2) a layer of a second semiconducting material 210 that forms a heterojunction with the layer of the first semiconducting material, (3) one or more components (e.g., electrodes, frontside field plate 240, and backside field plate 255) that are electrically coupled to a heterojunction formed between the first semiconducting material and the second semiconducting material, and (4) a second substrate 260, to which the layer of the first semiconducting material is bonded.

Although the above discussion discloses various example embodiments, it should be apparent that those skilled in the art can make various modifications that will achieve some of the advantages of the invention without departing from the true scope of the invention.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A semiconductor device, comprising:
   a layer of a first semiconducting material, the first semiconducting material comprising a first crystal structure;
   a layer of a second semiconducting material disposed adjacent to the layer of the first semiconducting material to form a heterojunction with the layer of the first semiconducting material;
   a substrate bonded to the layer of the first semiconducting material, the substrate comprising a second crystal structure, wherein the substrate is selected from the group consisting of silicon carbide, diamond, and aluminum nitride;
   a gate electrode;
   a drain electrode;
   a frontside field plate that is spaced apart from the drain electrode and is configured to spatially distribute an electric field between the gate electrode and the drain electrode; and
   a backside field plate that is electrically coupled to the heterojunction and disposed at least partially within a cavity formed by the first semiconducting material, the backside field plate comprising a surface that traverses a surface of the layer of the first semiconducting material adjacent to the substrate, wherein the backside field plate does not include a semiconductor material.

2. The semiconductor device of claim 1, further comprising a high electron-mobility transistor (HEMT) comprising:
   the layer of the first semiconducting material;
   the layer of the second semiconducting material; and
   the backside field plate.

3. The semiconductor device of claim 1, wherein each of the first semiconducting material and the second semiconducting material comprises a compound of one or more elements in group 13 of the periodic table with one or more elements in group 15 of the periodic table.

4. The semiconductor device of claim 3, wherein the first semiconducting material comprises gallium nitride and the second semiconducting material comprises aluminum gallium nitride, aluminum indium gallium nitride or aluminum nitride.

5. The semiconductor device of claim 1, wherein an edge of the backside field plate closest to the drain electrode is aligned with an edge of the frontside field plate or an edge of the gate electrode closest to the drain electrode.

6. The semiconductor device of claim 1, wherein the backside field plate comprises a metal material.

7. The semiconductor device of claim 1, wherein the backside field plate is an electrical conductor.

8. A semiconductor device, comprising:
   a layer of a first semiconducting material, the first semiconducting material comprising a first crystal structure, wherein the first semiconducting material defines a cavity;

a layer of a second semiconducting material disposed adjacent to the layer of the first semiconducting material to form a heterojunction with the layer of the first semiconducting material;

a gate electrode;

a drain electrode;

a frontside field plate that is spaced apart from the drain electrode and is configured to spatially distribute an electric field between the gate electrode and the drain electrode;

means for depleting channel electrons and distributing the electric field, the means for depleting channel electrons and distributing the electric field positioned at least partially in the cavity formed by the first semiconducting material such that an edge of the means for depleting channel electrons and distributing the electric field closest to the drain electrode of the device is aligned with an edge of the frontside field plate of the device or an edge of the gate electrode of the device closest to the drain electrode, wherein the means for depleting channel electrons and distributing the electric field does not include a semiconductor material; and means for structurally supporting the heterojunction and the means for depleting channel electrons and distributing the electric field.

9. The semiconductor device of claim 8, further comprising means for aligning the means for depleting channel electrons and distributing the electric field from a front side of the semiconductor device.

10. The semiconductor device of claim 8, wherein the means for depleting channel electrons and distributing the electric field includes a conductive material.

* * * * *